United States Patent

Nguyen

[11] Patent Number: 5,963,105
[45] Date of Patent: Oct. 5, 1999

[54] TRIMMABLE CIRCUITRY FOR PROVIDING COMPENSATION FOR THE TEMPERATURE COEFFICIENTS OF A VOLTAGE CONTROLLED CRYSTAL-LESS OSCILLATOR

[75] Inventor: Cong Dinh Nguyen, Sachse, Tex.

[73] Assignee: Dallas Semiconductor Corporation, Dallas, Tex.

[21] Appl. No.: 08/903,822

[22] Filed: Jul. 31, 1997

[51] Int. Cl.[6] .................................................. H03B 5/04
[52] U.S. Cl. ..................... 331/176; 331/186; 331/177 R; 331/17; 331/1 R
[58] Field of Search .................................... 331/176, 185, 331/186, 177 R, 1 R, 175, 17, 143

[56] References Cited

U.S. PATENT DOCUMENTS 3,388,344   6/1968   West ......................................... 331/185

*Primary Examiner*—Arnold Kinkead
*Attorney, Agent, or Firm*—Jenkens & Gilchrist P.C.

[57] ABSTRACT

In an integrated crystal-less device that generates an output signal with the frequency of the output signal dependent at least in part on a resistive element, there is provided circuitry for providing compensation for the temperature coefficient the of resistive element, the circuitry includes a bandgap reference and a resistive network. The bandgap reference utilizes components having stable temperature coefficient to generate a first voltage, a reference voltage, and also to generate second voltage, a voltage proportional to absolute temperature. The resistive network includes two trimmable resistors, which are trimmed such that the resistive network in combination with the bandgap reference compensates for the absolute value of the resistive element in a selected temperature range.

13 Claims, 2 Drawing Sheets

TRIMMABLE CIRCUITRY FOR PROVIDING COMPENSATION FOR THE TEMPERATURE COEFFICIENTS OF A VOLTAGE CONTROLLED CRYSTAL-LESS OSCILLATOR

FIELD OF THE INVENTION

This invention relates to oscillator circuits, and more particularly, but not by way of limitation, to trimmable circuitry for providing compensation for the temperature coefficients of temperature variant components of crystal-less oscillator circuits.

BACKGROUND OF THE INVENTION

There is a wide commercial market available for the use of high performance electronic real time clocks. One significant feature requirement of high performance electronic real time clocks is the use of a crystal to generate the time base for the oscillator circuitry. For example, a conventional prepackaged crystal oscillator includes a quartz crystal to provide the frequency reference, and an oscillator amplifier to excite the crystal to resonance, while other crystal oscillator circuit packages utilize an external quartz crystal. However, as the consumer need for more powerful, smaller and less expensive electronic systems continues to be a driving force behind many new products and systems that don't need quite the accuracy of a crystal oscillator but do need a relatively precise oscillator, the cost and size of conventional crystal oscillator real time clocks make them prohibitive.

One solution to the conventional crystal oscillator has been through the use of the RC oscillator circuit. Although this has proven to be a somewhat acceptable solution for systems which require low performance oscillator circuits, it has fallen short for systems requiring more precise oscillator circuits. This is primarily because RC oscillator circuits are not very stable during operation. The reason RC oscillator circulates are not as stable as crystal oscillator circuits is due to the lack of a stable oscillator element for use by the conventional RC oscillator circuits to phase-lock to or to count down from. As with crystal oscillator circuits, another problem with conventional RC oscillator circuits is they take up too much valuable pc-board space.

One proposed solution to the above described problem with existing oscillator circuits is to utilize a crystal-less oscillator circuit having a frequency-locked loop feedback topology to generate an output signal having a stable frequency, such as the oscillator circuit described herein. However, one problem encountered with this crystal-less oscillator circuit is the fluctuation of the frequency of the output signal over varying temperatures of the device during operation. The frequency variations are a result of the temperature coefficients of a resistive element upon which the frequency of the output signal is dependent.

Accordingly, based upon the foregoing, it should be understood and appreciated that there is a need for a low power, monolithic crystal-less integrated circuit oscillator that provides an output signal with frequency stability approaching that of conventional crystal oscillators, and includes circuitry that provides compensation for the temperature coefficients of the frequency determinative elements therein.

SUMMARY OF THE INVENTION

The present invention overcomes the above identified problems as well as other shortcomings and deficiencies of existing technologies by providing trimmable circuitry for providing compensation for the temperature dependency of a low power, monolithic integrated circuit crystal-less oscillator.

In an integrated crystal-less device that generates an output signal with the frequency of the output signal dependent at least in part on a resistive element, there is further provided circuitry for providing compensation for the temperature coefficient of a frequency determinative resistive element, the circuitry includes a bandgap reference and a resistive network. The bandgap reference utilizes components having stable temperature coefficients to generate a first voltage, a reference voltage, and also to generate second voltage, a voltage proportional to absolute temperature. The resistive network includes two trimmable resistors, which are trimmed such that the resistive network in combination with the voltages generated by bandgap reference provide compensation for the absolute value of the resistive element so as to stabilize the frequency of the output signal when operated in a select temperature range.

BRIEF DESCRIPTION OF THE DRAWINGS

A more complete understanding of the present invention may be had by reference to the following Detailed Description when taken in conjunction with the accompanying Drawings wherein.

DETAILED DESCRIPTION

Figure 1:
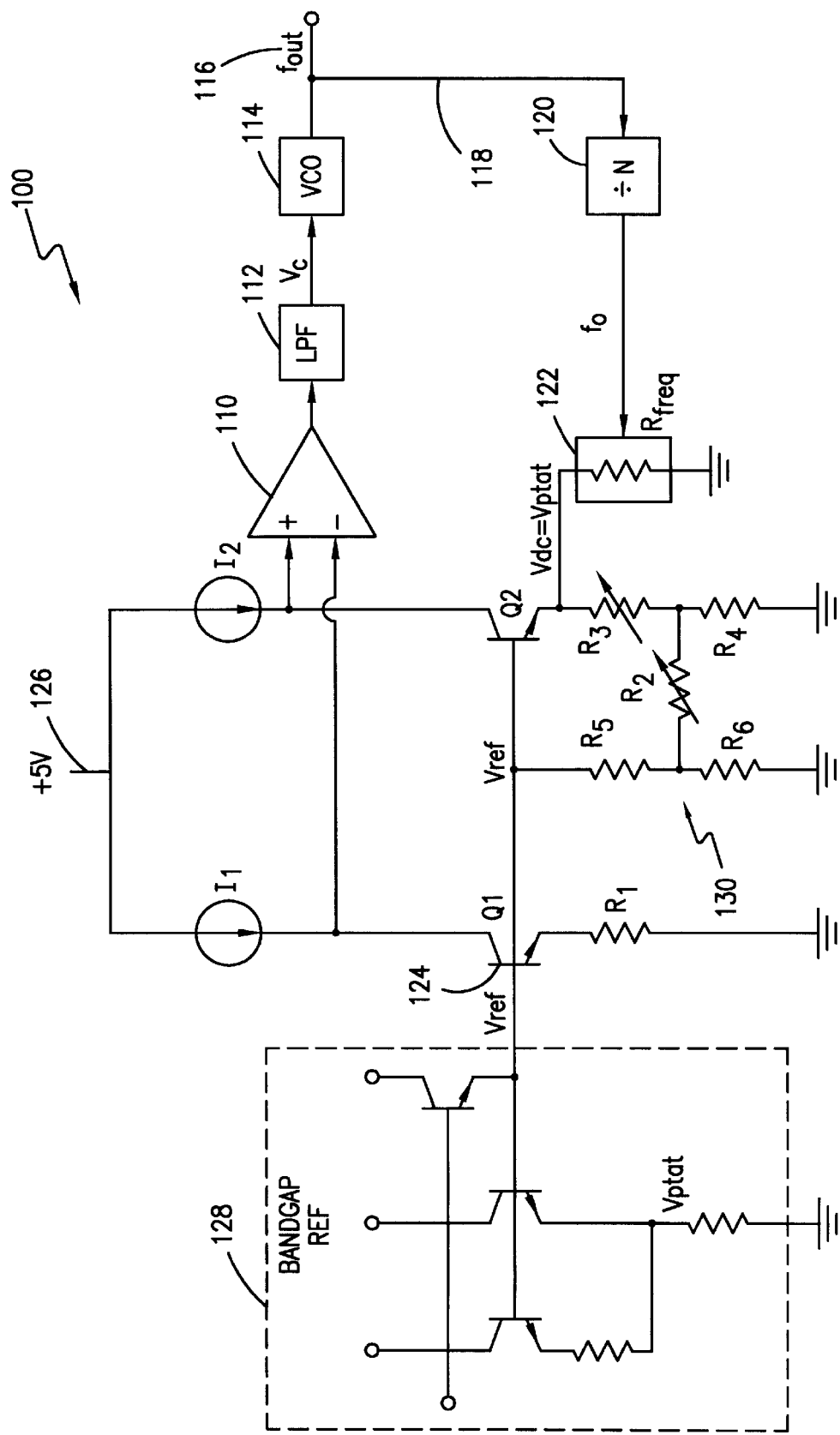
FIG. 1 is a schematic diagram illustrating crystal-less oscillator circuitry utilizing the present invention.

With reference now to FIG. 1, there is illustrated a schematic diagram illustrating an exemplary embodiment of crystal-less oscillator circuitry 100. As depicted crystal-less oscillator circuitry 100 includes two current sources, $I_1$ and $I_2$, each being connected to the inputs of difference amplifier 110. The output of difference amplifier 110 is connected to the input of a low pass filter 112. The output of low pass filter 112 is connected to the input of a voltage controlled oscillator 114. The output of voltage controlled oscillator 114 is connected to the output 116 of crystal-less oscillator circuitry 100. A frequency-lock feedback loop 118 is connected between output 116 and an input of difference amplifier 110. Frequency-lock feedback loop 118 includes a divide-by-N circuit 120, a frequency-controlled resistor $R_{freq}$ 122, and a transistor $Q_2$.

Still referring to FIG. 1, crystal-less oscillator circuitry 100 further includes an input 124 for receiving a reference voltage, $V_{ref}$, an input 126 for receiving an operating voltage, transistor $Q_1$ and resistor $R_1$. The above described elements, generally make up the oscillator circuitry of crystal-less oscillator circuitry 100 (described in more detail below).

As further depicted in FIG. 1, crystal-less oscillator circuitry 100 further includes a resistor network 130 which includes variable/trimmable resistors $R_2$ and $R_3$, and resistors $R_4$, $R_5$ and $R_6$, and a bandgap reference 128 for generating reference voltage $V_{ref}$ at input 124 and for generating a voltage proportional to absolute temperature ($V_{ptat}$). The voltages from bandgap reference 128 and resistor network 130 provide compensation for fluctuation in the frequency of the output signal due to the temperature coefficient of $R_1$ and $R_{freq}$. A detailed description of the operation of crystal-less oscillator circuitry 100 including the operation of bandgap reference 128 with resistor network 130 is given hereinbelow.

Figure 2:
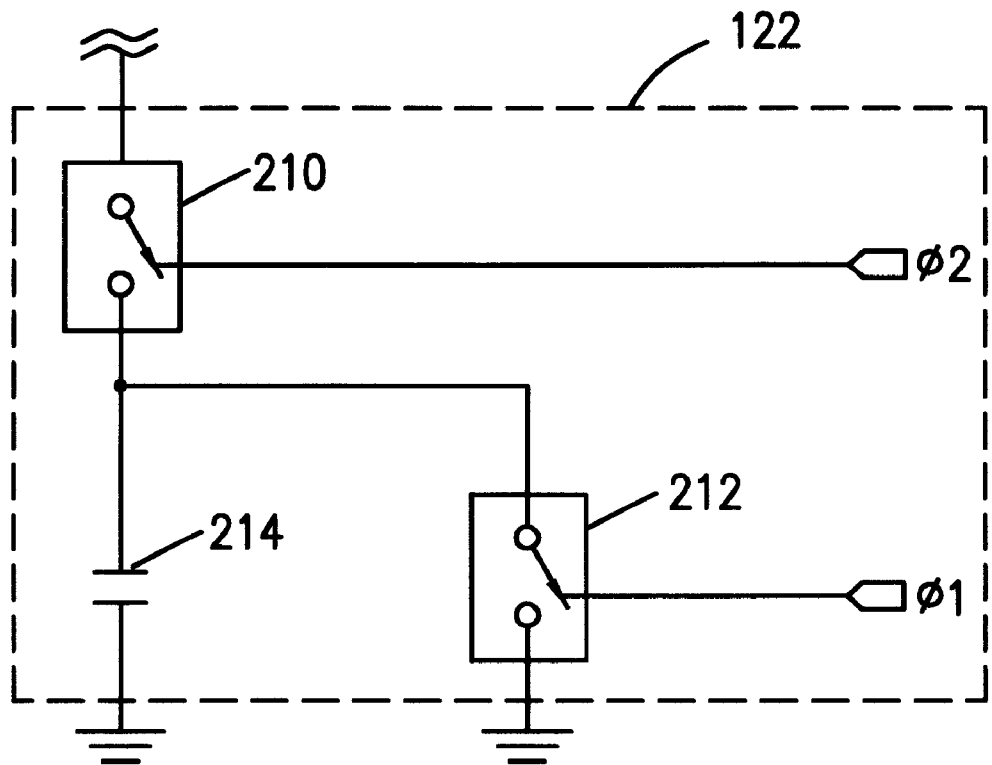
FIG. 2 is a schematic diagram illustrating an embodiment of a frequency-controlled resistor.

Referring now to FIG. 2, there is illustrated an exemplary embodiment of frequency-controlled resistor $R_{freq}$ 122. As depicted, frequency-controlled resistor $R_{freq}$ 122 is coupled in frequency-lock feedback loop 118 and is a switched-capacitor circuit, including switches 210 and 212, and capacitor 214.

Referring now to FIGS. 1 and 2, a more detailed description of the operation of crystal-less oscillator circuitry 100 will now be described. The output of voltage controlled oscillator 114, $f_{out}$, is the output of crystal-less oscillator circuitry 100. Divide-by-N circuit 120 divides down the frequency of the output signal of voltage controlled oscillator 114 to produce a feedback frequency signal, $f_o$, which is utilized in feedback loop 118 to stabilize and control the output frequency $f_{out}$.

Control voltage $V_C$ is for driving voltage controlled oscillator 114, and is derived from resistors $R_1$ and $R_{freq}$. Resistors $R_1$ and $R_{freq}$ are fed by current sources $I_1$ and $I_2$, such that the voltages across resistors $R_1$ and $R_{freq}$ drive difference amplifier 110. The output of difference amplifier 110 is fed into low pass filter 112. Low pass filter 112 removes the high frequency noise from the signal from the output of amplifier 110. The output of low pass filter 112 is the control voltage $V_C$, which is used by voltage control oscillator 114 to generate the output frequency $f_{out}$.

In this exemplary embodiment, frequency-controlled resistor, $R_{freq}$, is a switched-capacitor circuit, as is illustrated in FIG. 2. Switches 210 and 212 turn on and off with alternate non-overlapping phases φ1 and φ2 of the feedback frequency $f_o$. The charge Q on the switched-capacitor 214 is represented by the equation:

$$Q=CV$$

The current running through the switched-capacitor 214 is given by the equation:

$$I=C(dV/dT)=CV/T$$

where T is defined as $1/f_o$. As a result, the current is equal to $f_o CV$. Because R=V/I, the effective resistance of $R_{freq}=1/f_o C$, where C is the value of the capacitor of switched capacitor 214. Therefore as the output frequency $f_o$ increases, the resistance value of $R_{freq}$ decreases. As a result, the voltage at the plus input of the difference amplifier drops, reducing the value of the control voltage $V_C$ received by voltage controlled oscillator 114. And, because the output frequency, $f_{out}$, of voltage control oscillator 114 is directly proportional to the control voltage $V_C$, the output frequency, $f_{out}$, will decrease when the resistance value of $R_{freq}$ decreases. When the resistance value of $R_{freq}$ equals the resistance value of $R_1$, feedback loop 118 is in a "lock" condition and the control voltage $V_C$ will remain constant. When $V_C$ remains constant, the output frequency $f_{out}$ is also constant. Because oscillator circuit 100 is a standalone oscillator, there is no external reference frequency onto which oscillator 100 can "lock", as is the case with phase-locked loop (PLL) circuits.

The output frequency $f_{out}$ of oscillator circuit 100 is given by the equation:

$$f_{out}=N/(R_1 C)$$

Therefore, the output frequency $f_{out}$ of oscillator circuit 100 is determined by the value of N (the frequency divider number of divide-by-N circuit 120), the resistance value of $R_1$, and the value of switched capacitor 214.

By operating resistors $R_1$ and $R_{freq}$ from current sources $I_1$ and $I_2$, along with the frequency-lock feedback loop 118, a low voltage sensitivity is maintained, so long as the open-loop gain of amplifier 110 is high.

As described above, the expected frequency of the output signal at the output $f_{out}$ of crystal-less oscillator circuitry 100 depends upon the resistance value of resistor $R_1$ and the capacitance value of C, the value of the capacitor in switched capacitor 214. Therefore, as the resistance value of $R_1$ and the capacitance value of switched capacitor 214 vary, the frequency of the output signal of output $f_{out}$ will also vary. As can also be appreciated, these values will vary with varying operating temperatures. The extent that these elements vary with temperature is dependent upon their respective temperature coefficients, i.e. the closer the temperature coefficient of the element is to zero, the less the absolute value of the element will change over temperature. To reduce the effects of temperature on switched capacitor 214 good results have been achieved by using a typical CMOS capacitor therefor. This provides for a very low temperature coefficient for switched capacitor 214, such that, over selected temperature operating ranges, the variance of the capacitance of switched capacitor 214 is negligible. However, the same could not be achieved for resistor $R_1$, where the temperature coefficient of resistor $R_1$ could not be significantly reduced. Therefore, resistor network 130, which includes variable resistors $R_2$ and $R_3$, and resistors $R_4$, $R_5$ and $R_6$, and bandgap reference 128 are used to compensate for the temperature coefficient of resistor $R_1$ and temperature coefficient of $R_{freq}$ if there is any and therefore stabilize the frequency of the output signal at $f_{out}$ 116 over a select temperature range.

Still referring to FIG. 1, bandgap reference 128 generates $V_{ref}$, a reference voltage, and $V_{ptat}$, a voltage proportional to absolute temperature, with each of the temperature coefficients known for both $V_{ref}$ and $V_{ptat}$. As illustrated in FIG. 1, resistors $R_3$ and $R_4$ are generally added in parallel to frequency-controlled resistor $R_{freq}$. As the current to capacitor 214 of frequency controlled resistor $R_{freq}$ is highly variable, i.e. Q2 is turned on and off, $R_3$ and $R_4$ partially stabilize the current through Q2. $R_3$ is a trimmable variable resistor so that it can be trimmed to help compensate for the absolute value of the temperature coefficient of the combination of resistor $R_1$ and switched capacitor 214. As further illustrated in FIG. 1, variable resistor $R_2$ and resistors $R_5$ and $R_6$ are coupled to the base of transistor Q2 to receive $V_{ref}$, and are also coupled to resistors $R_3$ and $R_4$. Similar to resistor $R_3$, resistor $R_2$ is also a trimmable variable resistor. In operation by knowing the temperature coefficient of the voltages $V_{ref}$ and $V_{ptat}$ of bandgap reference 128, in combination with the temperature coefficients of resistor $R_1$ and $R_{freq}$, resistor $R_2$ and $R_3$ can be trimmed to compensate for these temperature coefficients for a select operating temperature range.

For example, assuming $R_1$ has a negative temperature coefficient, the current to Q1 will increase with temperature as the resistance of $R_1$ decreases with increasing temperature. As described above, assuming the current to capacitor 214 will not significantly fluctuate with the change in temperature. Therefore, to compensate for the increase in current through $R_1$, the current to $R_3$ must also be increased beyond its own increase in current. Therefore, variable resistor $R_2$ can be trimmed to compensate for this.

During manufacture, a target temperature is selected, such that with bandgap reference 128 and the known temperature coefficients of $V_{ref}$ and $V_{ptat}$, resistors $R_2$ and $R_3$ will be trimmed to compensate for the absolute values and temperature coefficients of $R_1$ and capacitor 214.

Those skilled in the art can realize that the teachings of the present invention as described hereinabove provides circuitry that, in an integrated crystal-less device 100 that generates an output signal $f_{out}$ with the frequency of the output signal dependent at least in part on a resistive element $R_1$, provides compensation for the temperature coefficient of the frequency determinative resistive element $R_1$, the circuitry including a bandgap reference 128 and a resistive network 130. The bandgap reference 128 utilizes components having stable temperature coefficient to generate a first voltage, a reference voltage, and also to generate second voltage, a voltage proportional to absolute temperature. The resistive network 130 includes two trimmable resistors $R_2$ and $R_3$, which are trimmed such that the resistive network 130 in combination with the voltages generated by bandgap reference 128 provides compensation for the absolute value of the resistive element in a selected temperature range so as to stabilize the frequency of the output signal.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. In a monolithic crystal-less oscillator device, circuitry for providing compensation for the temperature dependency of at least a resistive element of the crystal-less oscillator device, said circuitry comprising:

a voltage reference generator connected to a base of a first transistor of the monolithic crystal-less oscillator, said voltage reference generator for generating a first voltage with a stable temperature coefficient and a second voltage with a stable temperature coefficient; and a resistor network coupled between the base and an emitter of the first transistor of the monolithic crystal-less oscillator, said resistor network including a plurality of resistors, said plurality of resistors including a first resistor connected to the emitter of the first transistor, and further including a second resistor connected to said first resistor with said first resistor and said second resistor generally coupled in parallel with a frequency-controlled resistor of the monolithic crystal-less oscillator.

2. The circuitry as recited in claim 1, wherein said first resistor is trimmable.

3. The circuitry as recited in claim 2, wherein said plurality of resistors includes a third resistor connected to the base of the first transistor.

4. The circuitry as recited in claim 3, and wherein said plurality of resistors includes a fourth resistor connected to said third resistor and between said first trimmable resistor and said second resistor, said fourth resistor being trimmable.

5. The circuitry as recited in claim 4, wherein said plurality of resistors includes a fifth resistor connected to said third resistor and said fourth resistor.

6. A device for providing compensation for the temperature dependency of a crystal-less oscillator circuitry, said device comprising:

a first resistor coupled to an emitter of a first transistor of the crystal-less oscillator circuitry; and a second resistor coupled to said first resistor, with said first resistor and said second resistor being generally coupled in parallel with a frequency-controlled resistor of the crystal-less oscillator circuitry.

7. The device as recited in claim 6, wherein said first resistor is a variable resistor.

8. The device as recited in claim 6, and further comprising a voltage generator coupled to the base of the first transistor, said voltage generator for generating a reference voltage.

9. The device as recited in claim 6, and further comprising a third resistor coupled to the base of the first transistor.

10. The device as recited in claim 9, and further comprising a fourth resistor coupled to said third resistor and between said first resistor and said second resistor.

11. The device as recited in claim 10, wherein said fourth resistor is a variable resistor.

12. The device as recited in claim 10, and further comprising a fifth resistor coupled to said third resistor and said fourth resistor.

13. The device as recited in claim 12, and further comprising a voltage generator coupled to the base of the first transistor, said voltage generator for generating a reference voltage.

* * * * *